(12) United States Patent
Guenoun et al.

(10) Patent No.: US 7,321,648 B2
(45) Date of Patent: Jan. 22, 2008

(54) DRIFT COMPENSATION SYSTEM AND METHOD IN A CLOCK DEVICE OF AN ELECTRONIC CIRCUIT

(75) Inventors: Lionel Guenoun, Nice (FR); Denis Roman, LaTurbie (FR); Jean-Pierre Suzzoni, Cagnes sur Mer (FR)

(73) Assignee: International Business Machines Corporation, Armonk, NY (US)

( * ) Notice: Subject to any disclaimer, the term of this patent is extended or adjusted under 35 U.S.C. 154(b) by 680 days.

(21) Appl. No.: 10/710,279

(22) Filed: Jun. 30, 2004

(65) Prior Publication Data

US 2006/0002499 A1    Jan. 5, 2006

(30) Foreign Application Priority Data

Aug. 13, 2003   (EP)   ................................ 03368079

(51) Int. Cl.
*H04L 7/00*      (2006.01)
(52) U.S. Cl. ...................... 375/371; 375/376; 375/327; 375/354
(58) Field of Classification Search ........ 375/371–376, 375/215, 226, 243, 326–327, 355–357; 327/146–150, 327/156
See application file for complete search history.

(56) References Cited

U.S. PATENT DOCUMENTS

| 6,664,827 | B2 * | 12/2003 | O'Leary et al. ............. 327/156 |
| 6,864,734 | B2 * | 3/2005 | Okamura .................... 327/291 |
| 6,877,103 | B2 * | 4/2005 | Kuo et al. .................. 713/500 |
| 2004/0264619 | A1 * | 12/2004 | Bonaccio et al. ........... 375/373 |

* cited by examiner

*Primary Examiner*—Shuwang Liu
*Assistant Examiner*—Hirdepal Singh
(74) *Attorney, Agent, or Firm*—Steven Capella

(57) ABSTRACT

A drift compensation system includes a first clock phase alignment circuit adapted for providing an output clock signal which is frequency locked to an input reference clock signal; a second clock phase alignment circuit identical to the first clock phase alignment circuit but wherein the reference clock signal is the output clock signal provided by the first clock phase alignment circuit; first deviation means at the output of the first clock phase alignment circuit for providing a first deviation between its current clock phase and its initial clock phase; second deviation means at the output of the second clock phase alignment circuit for providing a second deviation between its current clock phase and its initial clock phase; and a phase control logic adapted for providing first phase shift signals as inputs to the first clock phase alignment circuit in order to cancel the phase shift between the output clock signal and the reference clock signal in response to the difference between the first and the second deviations.

14 Claims, 3 Drawing Sheets

DRIFT COMPENSATION SYSTEM AND METHOD IN A CLOCK DEVICE OF AN ELECTRONIC CIRCUIT

BACKGROUND OF INVENTION

The present invention relates to systems used to adjust the phase shift between the sampling clock and the data companion clock of an electronic chip adapted to receive data. In particular, the invention relates to a drift compensating system and method in a clock device of an electronic circuit.

High speed electronic circuits such as electronic chips widely used today, especially in telecommunication systems, are implementing electric interfaces consisting of a data and/or control high speed bus synchronized to one or more companion clocks provided at the interface according to various standards.

To properly process data or control signals, it is necessary for an electronic component receiving these signals as inputs to sample them appropriately at their input point. This is generally achieved using a training sequence during which the emitter component delivers a number of known training patterns on data/control signals while a receiver component controls and tunes its input sampling circuitry to properly recognize these patterns prior to switch to the operational mode.

Another technique to ensure optimum data sampling without requiring any data training sequence is illustrated in FIG. 1. A variety of implementations can be found depending on component manufacturer technology as well as low level design options or requirements. One implementation example is described in Xilin application note XAPP268.

In the implementation of FIG. 1, the data are received as parallel inputs by input receivers 10 and transmitted to the input flip-flops 12 which are clocked by the sampling clock signals received on inputs 14 which are provided by a clock phase alignment circuit.

The clock phase alignment circuit 16 is built around a clock management circuit 18 which has the property of acting like a phase locked loop circuit and provides one (or more) clock signal frequency locked to an input reference clock and whose phase is controlled with respect to the input reference clock. The latter is provided by the receiver 19 on input 20, used as a sampling clock for the data module as mentioned above. For this, the input clock drives an input flip-flop 21 (identical to data flip-flops 12) which is clocked by the output 22 and provides a sampled clock to control logic 24 which is typically a state machine. Control logic 24 monitors the sampled clock and permanently controls the clock management phase shift.

On startup (i.e. after the module reset), the phase shift of the clock management circuit 18 is set to a known predetermined value. The control logic 24 then examines the sampled clock output and evaluates it against a theoretical result (i.e., a bit to 1 or to 0) that should be obtained when sampled properly. The control logic 24 then alters the phase shift by one step or a small number of steps by sending either a phase advance or a phase delay to the clock management circuit 18. These evaluation/alteration operations are repeated as many times as necessary to determine a phase step validity window for which both input flip-flop setup and hold time are met to ensure a correct sampling. Once the window is determined, the control logic 24 asserts its "aligned" indicator 26 and the module can turn to the operational mode. Assuming an acceptable skew between the input data and the input clock and considering the close matching between devices in the same piece of silicon, the resulting alignment if suitable for the input clock signal is also suitable for data going across identical electronic structure.

In summary, the technique illustrated in FIG. 1 takes advantage of a clock signal to be a training sequence by nature and avoids using a specific data sequence. It ensures a clocking circuitry to match input flip-flop setup and hold time for proper input data sampling. Unfortunately, this system runs only once at startup time and then freezes the clock circuitry unless the whole system is started again. Furthermore, silicon timing characteristics may vary in time depending on environmental conditions (temperature, power, supply voltage, etc.), resulting in a drift which cannot ensure an optimum sampling.

SUMMARY OF INVENTION

The present invention addresses the above-noted difficulties by providing a system and method enabling a clock circuit to be always in operational mode without requiring resetting the module in order to cancel a clock phase shift.

In addition, the present invention provides a system and method enabling any phase drift due to a change in silicon timing characteristics to be canceled without requiring resetting of the module.

In accordance with a first aspect of the invention, a drift compensation system comprises a first clock phase alignment circuit adapted for providing an output clock signal which is frequency locked to an input reference clock signal, a second clock phase alignment circuit identical to the first clock phase alignment circuit but wherein the reference clock signal is the output clock signal provided by first clock phase alignment circuit, first deviation means at the output of the first clock phase alignment circuit for providing a first deviation between its current clock phase and its initial clock phase, second deviation means at the output of the second clock phase alignment circuit for providing a second deviation between its current clock phase and its initial clock phase, and a phase control logic adapted for providing first phase shift signals as inputs to the first clock phase alignment circuit in order to cancel the phase shift between the output clock signal and the reference clock signal in response to the difference between the first and the second deviations.

According to a second aspect of the invention, a drift compensation method for canceling the phase drift in a system as defined above comprises the steps of: aligning, at defined times, the clock phase in the second clock phase alignment circuit by frequency locking the output clock signal to the input reference signal, determining the deviation for each of the first and second clock phase alignment circuits which is the difference between the number of current steps needed for the alignment of the circuit and the number of steps needed for the initial alignment, checking whether the second deviation needed for the second clock phase alignment circuit is different from the first deviation needed for the first clock phase alignment circuit, and if the second deviation is different from the first deviation, shifting by one step the phase of the first clock phase alignment circuit.

DETAILED DESCRIPTION

Figure 1:
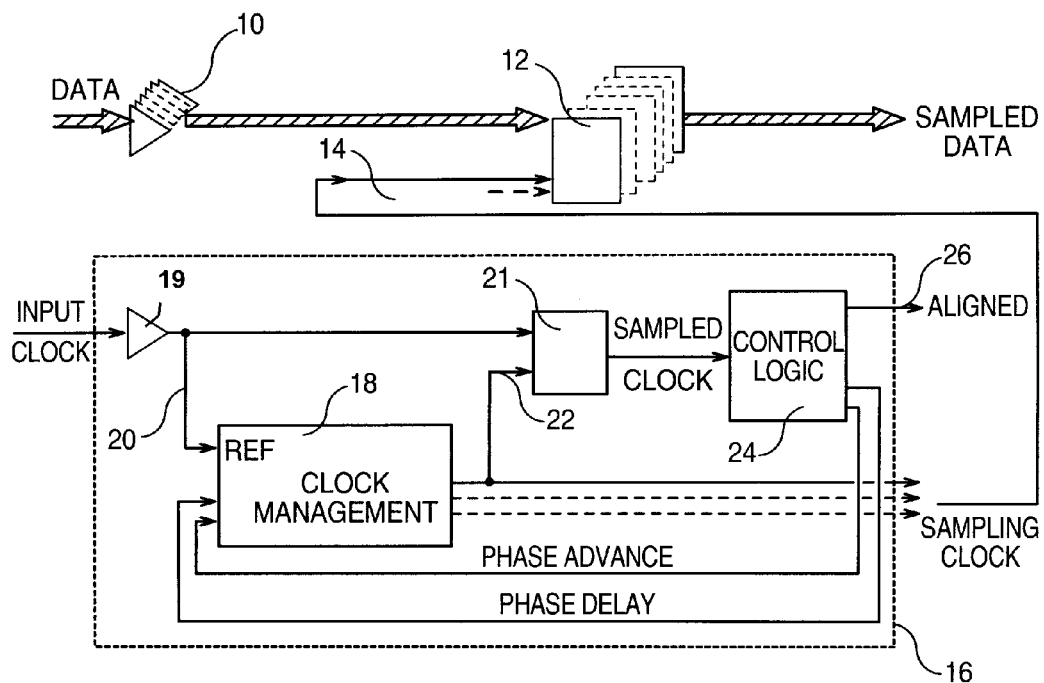
FIG. 1 is a block-diagram representing a conventional system used to cancel the clock phase shift in the clock circuitry of an electronic circuit.
Figure 2:
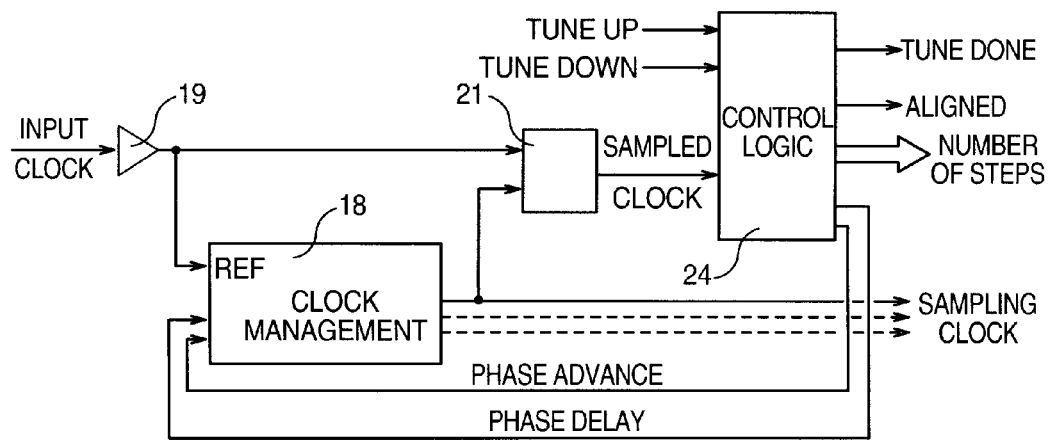
FIG. 2 is a block-diagram representing an improved clock phase alignment circuit incorporated in a drift compensation system according to an embodiment of the invention.

A conventional clock phase alignment circuit 16 is illustrated in FIG. 1. An improved circuit, incorporated into the drift compensation system according to the invention, includes additional features illustrated in FIG. 2. These features are an additional output carrying information regarding the number of phase steps the clock management circuit 18 is being run, additional inputs (tune up, tune down) requesting the control logic to advance or to delay the clock management circuit phase by one step (or a small fixed number of steps) and an additional output (tune done) provided in response to "tune up" and "tune down" indicating that the requested operation has been completed. Advancing or delaying the clock management circuit phase by one step or a small fixed number of steps allows to smooth sampling clock phase variations without the need of additional circuitry: it acts as an built-in integrator.

Figure 3:
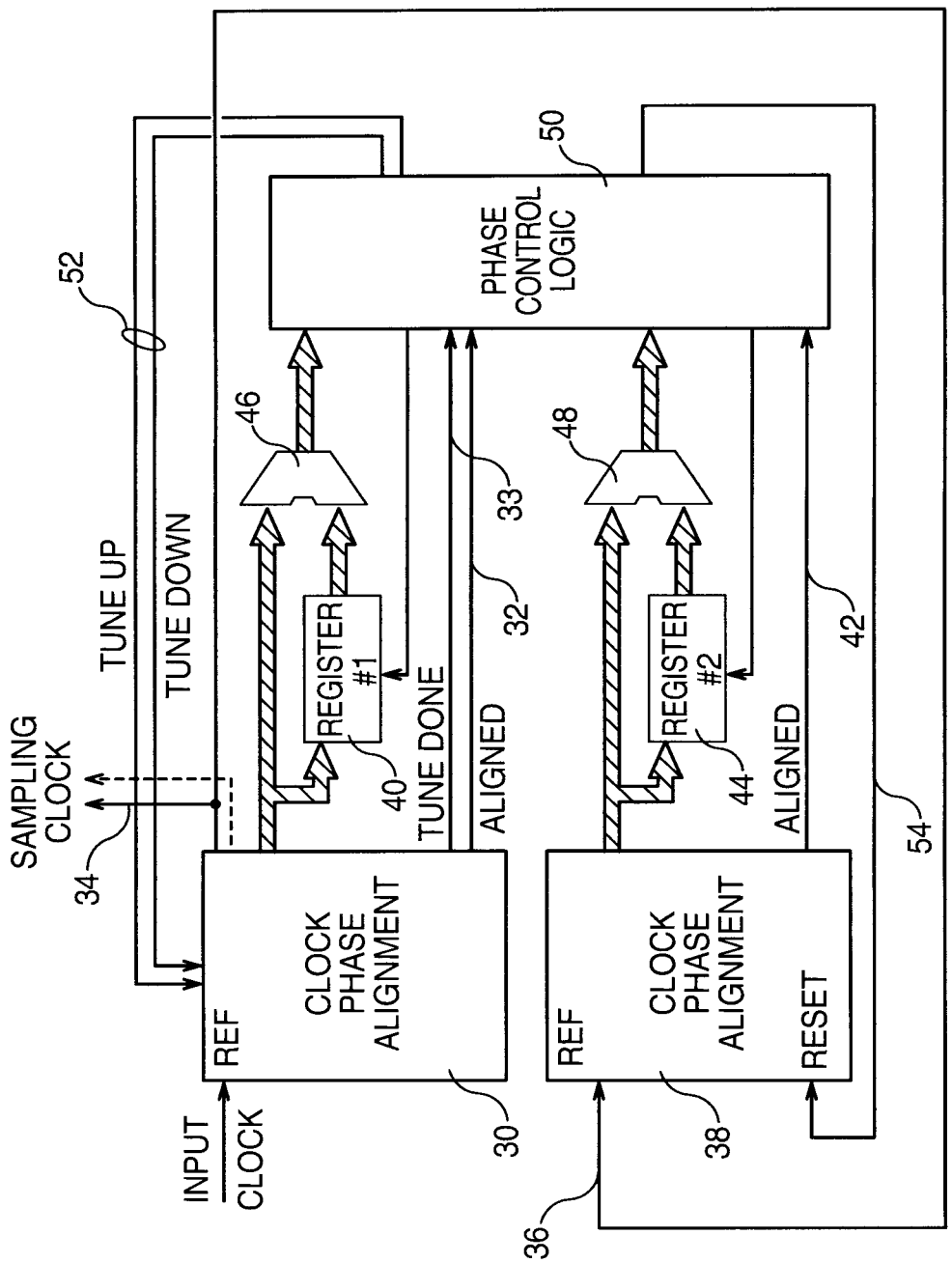
FIG. 3 is a block-diagram representing a preferred embodiment of the drift compensation system according to the invention.

As illustrated in FIG. 3, two clock phase alignment circuits like the clock phase alignment circuit 16 of FIG. 1 are used in the drift compensation system according to the invention. The first clock phase alignment circuit 30 is driven by the input clock used as a reference clock. As already explained, on startup, the phase shift of the circuit is set to a known, predetermined value and after a processing time, it asserts its "aligned" output 32 meaning that the module is turned in the operational mode and provides operational sampling clock signals on the output 34. At this time, a sampling clock signal is taken from clock phase alignment circuit 30 and fed back by line 36 as input reference clock for a second clock phase alignment circuit 38. This allows operation of circuit 38 at exactly the same frequency as circuit 30 while avoiding additional load to the input clock circuitry.

At the same time that "aligned" line is asserted, the initial number of steps used to cancel the phase shift in clock phase alignment 30 is stored in a first register 40. Likewise, when the output line "aligned" 42 of clock phase alignment circuit 38 is asserted, the initial number of steps used to cancel the phase shift in this circuit is stored in a second register 44. Then, at each subsequent phase alignment operation, the number of steps which have been necessary to cancel the phase shift are subtracted in subtractor 46 for clock phase alignment circuit 30 and in subtractor 48 for clock phase alignment circuit 38 in order to know the deviation value for each circuit. Then, the phase control logic 50 which is typically a state machine performs a comparison between deviations provided by the first and the second clock phase alignment circuitry 30 and 38 in order to forward either a tune up signal or a tune down signal on lines 52 to the first clock phase alignment circuit 30 in order to control this one in the operation of canceling the phase shift. Note that the phase control logic 50 provides also a reset signal on line 54 to the clock phase alignment circuit 38, and the reset releasing signal on the same line to launch the phase shift operation by the clock phase alignment circuit 38.

Figure 4:
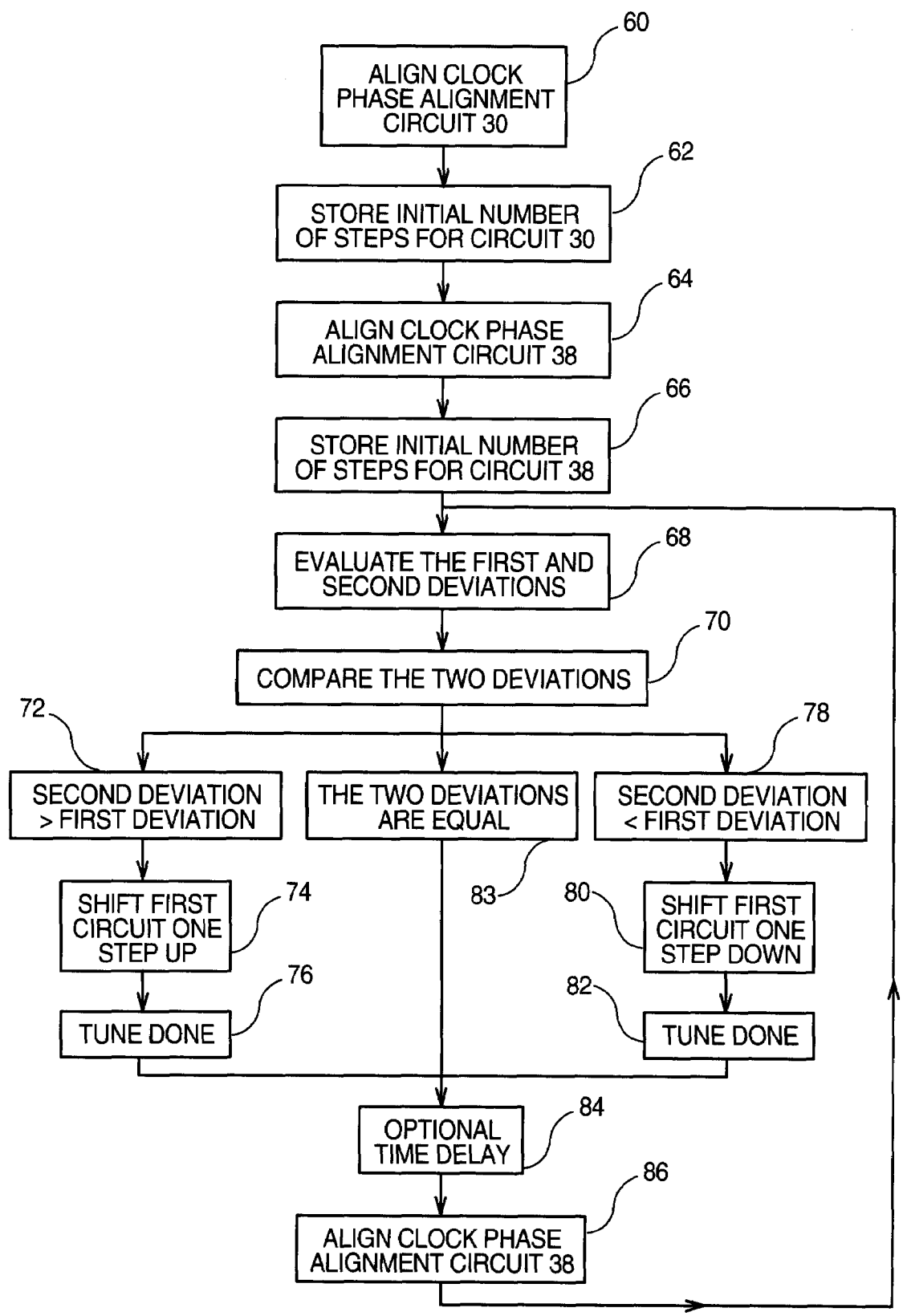
FIG. 4 is a flow chart of a drift compensation method, in accordance with another embodiment of the invention.

Now, the method of drift compensation is described in reference to FIG. 4. The first step (step 60) consists in aligning the first clock phase alignment circuit 30, on startup, when the circuit has been reset released. It runs an alignment sequence while the phase control logic holds clock phase alignment 38 on reset state. When the alignment is done, clock phase alignment circuit 30 asserts its "aligned" output line 32.

At this point, the number of phase steps of phase clock alignment circuit 30 is frozen and the phase control logic 50 takes necessary actions to store its value as initial number of phase steps into register 40 (step 62). Once phase clock alignment circuit 30 is aligned, the sampling clock on output line 34 can be used as operational sampling clock for data modules. Then, phase control logic 50 releases clock phase alignment circuit 38 to run its own phase alignment sequence (step 64). When this is completed, an "aligned" indicator on output line 42 is asserted, and the number of initial phase steps for clock phase alignment circuit is stored into register 44 (step 66).

After this initial alignment procedure, the electronic component is operational but phase alignment procedures are achieved from time to time or on a periodic basis and a number of phase steps necessary for the alignment different from the initial number of steps may be found. It is why the next step consists in evaluating the first deviation provided by subtractor 46 at the output of clock phase alignment circuit 30 and the second deviation provided by subtractor 38 at the output of clock phase alignment circuit 38 (step 68) and to compare them in phase control logic 50 (step 70). It must be noted that the two deviations are equal to zero at the initial pass for the two clock phase alignment circuits.

Assuming that there is a drift in silicon characteristics and that the deviation procedure for clock phase alignment circuit 38 has been run at least one time, the second deviation (for clock phase alignment circuit 38) is no longer zero. This deviation represents the shift in phase steps (that is a known fraction of a clock period) between the current optimum alignment and the initial alignment for clock phase alignment circuit 38. Therefore, there is a chance that the second deviation be different from the first deviation. If it is checked that the second deviation is greater than the first deviation (step 72), the clock phase alignment circuit 30 is phase shifted one step up (step 74) and the "tune done" signal is sent to phase control logic 50 on line 33 (step 76). If it is checked that the second deviation is less than the first deviation (step 78), the clock phase alignment circuit 30 is phase shifted one step down (step 80) and the "tune done" signal on line 33 is activated (step 82). Note that, since first and second clock phase alignment circuits 30 and 38 are operating at the same frequency, it makes sense to adjust the first clock phase alignment circuit 30 phase shift so that the difference between the targeted new alignment and the initial alignment becomes equal to the deviation of the second clock phase alignment circuit 38. This is achieved by tuning the first circuit 30 in the appropriate direction using the tune lines 52.

In both cases (the first and the second deviations are different) and after the activation of the "tune done" signal, or if the two deviations are equal (step 83), an optional time delay is set by the phase control logic to start again the deviation procedure (step 84). Such a delay can be variable or defined on a periodical basis. When this defined delay is passed, a new alignment of the clock phase alignment circuit 38 is achieved (step 86) before the process loops back to the step of evaluating the first and the second deviations.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following

We claim:

1. A drift compensation system comprising:
   a first clock phase alignment circuit for providing an output clock signal which is frequency locked to an input reference clock signal;
   a second clock phase alignment circuit having input thereto the output clock signal provided by said first clock phase alignment circuit;
   a first deviation means at an output of said first clock phase alignment circuit for providing a first deviation between a current clock phase of said first clock phase alignment circuit and an initial clock phase thereof;
   a second deviation means at an output of said second clock phase alignment circuit for providing a second deviation between a current clock phase of said second clock phase alignment circuit and an initial clock phase thereof; and
   a phase control logic for providing first phase shift signals as inputs to said first clock phase alignment circuit to cancel a phase shift between said output clock signal and said reference clock signal in response to a difference between said first deviation and said second deviation.

2. A drift compensation system according to claim 1, wherein
   each of said first and second clock phase alignment circuits comprising a clock management circuit for providing said output clock signal which is frequency locked to said input reference clock signal; and
   a control logic provides second phase shift signals in response to said output clock signal, each of said second phase shift signals being an input step to said clock management circuit to reduce to zero said phase shift in a number of steps.

3. A drift compensation system according to claim 2, wherein
   said first deviation means and said second deviation means each includes a register for storing an initial number of steps used at startup of the respective clock phase alignment circuit for reducing said phase shift to zero, and
   a subtractor for subtracting said initial number of steps from a current number of steps necessary to reduce said phase shift to zero after said startup, in order to obtain respectively said first deviation or said second deviation.

4. A drift compensation system according to claim 3, wherein each of said first phase shift signals provided by said phase control logic is input to said first clock phase alignment circuit to reduce to zero said phase shift between said output clock signal and said reference signal.

5. A drift compensation method for canceling the phase drift in a drift compensation system including a first clock phase alignment circuit and a second clock phase alignment circuit, the first clock phase alignment circuit being adapted to provide an output clock signal frequency locked to an input reference clock signal, the method comprising the steps of:
   aligning, at defined times, a clock phase in the second clock phase alignment circuit by frequency locking the output clock signal to the input reference signal;
   determining a first deviation for each of said first and second clock phase alignment circuits, where said first deviation in a given circuit is characterized by a difference between a number of current steps needed for alignment of that circuit and a number of steps needed for the initial alignment;
   checking whether a second deviation needed for said second clock phase alignment circuit is different from the first deviation needed for said first clock phase alignment circuit; and
   if the second deviation is different from the first deviation, shifting by one step the phase of said first clock phase alignment circuit.

6. A drift compensation method according to claim 5, wherein said step of shifting comprises shifting one step up if said second deviation is greater than said first deviation or shifting one step down if said second deviation is less than said first deviation.

7. A drift compensation method according to claim 5, further comprising a step, before said aligning step, of aligning on startup said first clock phase alignment circuit and storing a number of phase shifts as an initial number of steps for said first clock phase alignment circuit.

8. A drift compensation method according to claim 7, wherein the drift compensation system further includes a phase control logic, and an aligned signal is provided by the first clock phase alignment circuit to the phase control logic when said first clock phras alignment circuit has been aligned.

9. A drift compensation method according to claim 8, wherein said first clock phase alignment circuit provides a sampling clock when said first clock phase alignment circuit has been aligned, said sampling clock being used as a clock for data modules.

10. A drift compensation method according to claim 9, wherein said second clock phase alignment circuit is enabled to be aligned when said aligned signal is provided by said first clock phase alignment circuit, the number of phase shifts needed for such an alignment being stored as an initial number of steps for said second clock phase alignment circuit.

11. A drift compensation method according to claim 6, further comprising a step, before said aligning step, of aligning on startup said first clock phase alignment circuit and storing a number of phase shifts as an initial number of steps for said first clock phase alignment circuit.

12. A drift compensation method according to claim 11, wherein the drift compensation system further includes a phase control logic, and an aligned signal is provided by the first clock phase alignment circuit to the phase control logic when said first clock phase alignment circuit has been aligned.

13. A drift compensation method according to claim 12, wherein said first clock phase alignment circuit provides a sampling clock when said first clock phase alignment circuit has been aligned, said sampling clock being used as a clock for data modules.

14. A drift compensation method according to claim 13, wherein said second clock phase alignment circuit is enabled to be aligned when said aligned signal is provided by said first clock phase alignment circuit, the number of phase shifts needed for such an alignment being stored as an initial number of steps for said second clock phase alignment circuit.

* * * * *